United States Patent
Wang et al.

(10) Patent No.: US 10,860,141 B2
(45) Date of Patent: Dec. 8, 2020

(54) LED CIRCUIT AND TOUCH SENSING METHOD

(71) Applicants: Tsun-I Wang, Taoyuan (TW); Ching-Chun Wu, Taoyuan (TW); Chia-Liang Yang, Taoyuan (TW)

(72) Inventors: Tsun-I Wang, Taoyuan (TW); Ching-Chun Wu, Taoyuan (TW); Chia-Liang Yang, Taoyuan (TW)

(73) Assignee: Dynascan Technology Corp., Taoyuan (TW)

( * ) Notice: Subject to any disclaimer, the term of this patent is extended or adjusted under 35 U.S.C. 154(b) by 0 days.

(21) Appl. No.: 16/593,979

(22) Filed: Oct. 5, 2019

(65) Prior Publication Data
US 2020/0310567 A1    Oct. 1, 2020

(30) Foreign Application Priority Data

Mar. 29, 2019   (TW) .............................. 108111207 A

(51) Int. Cl.
*G06F 3/042*   (2006.01)
*G09G 3/32*    (2016.01)
*H01L 27/15*   (2006.01)
*G06F 3/041*   (2006.01)

(52) U.S. Cl.
CPC ............ *G06F 3/042* (2013.01); *G06F 3/0412* (2013.01); *G09G 3/32* (2013.01); *H01L 27/156* (2013.01); *G09G 2360/144* (2013.01)

(58) Field of Classification Search
CPC ......... G06F 3/042; G06F 3/0412; G09G 3/32; G09G 2360/144; H01L 27/156
See application file for complete search history.

(56) References Cited

U.S. PATENT DOCUMENTS

| | | | |
|---|---|---|---|
| 2003/0122749 A1* | 7/2003 | Booth, Jr. ............ | G09G 3/3208 345/82 |
| 2013/0221856 A1* | 8/2013 | Soto ...................... | H05B 45/60 315/152 |
| 2015/0348504 A1* | 12/2015 | Sakariya .............. | G09G 3/2092 345/206 |
| 2015/0364107 A1* | 12/2015 | Sakariya ................ | G06F 3/042 345/174 |
| 2017/0357379 A1* | 12/2017 | Booth ................... | G06F 3/0412 |

* cited by examiner

*Primary Examiner* — Michael Pervan

(57) ABSTRACT

The invention discloses a LED circuit and a touch sensing method. Said method, as applied to an array of LEDs, comprises the following steps. First, a driving signal is provided. The driving signal is configured to set at least one of the LEDs in a driven mode or a sensing mode. When a LED is set in the sensing mode, it receives an environmental light, whose intensity is then compared to a first threshold. When said intensity is below that threshold, the location corresponding to the LED is marked as a touch location.

9 Claims, 3 Drawing Sheets

LED CIRCUIT AND TOUCH SENSING METHOD

CROSS REFERENCE TO RELATED APPLICATION

The present application claims priority to Taiwan patent application Serial No. 108111207 filed on, Mar. 29, 2019, and the entire content of which is incorporated by reference to this application.

1. Field of the Invention

The present invention is related to a circuit and a method for touch sensing, especially to a LED circuit and a touch sensing method in which touches are sensed using light-emitting diodes.

2. Description of the Prior Art

With the advance of semiconductor technology, light-emitting diodes (LEDs) can be as miniscule as microns-wide, and can thus be used to display even higher-definition images. LED displays of various sizes have become available and prevalent in all sorts of electronic products. A mobile phone or a wearable device, for instance, may incorporate a small LED display as its screen. To enable gesture control of the device, the manufacturer usually couples the screen with a touch sensing module, be it capacitive, resistive, ultrasonic, or infrared.

Such a module, which detects the approach or movement of fingers or objects, is by nature external to the LED display and may affect it negatively. The display's light output ratio could be reduced due to the existence of the touch sensing module, or it might be hard to bring down the thickness of the screen as a whole. Furthermore, cost considerations often render the number of sensing spots provided by the module inadequate to perform accurate detection. A new breed of LED circuit and touch sensing method is truly called for to address the aforementioned problems.

SUMMARY OF THE INVENTION

The present invention provides a LED circuit wherein the characteristics inherent to light-emitting diodes (LEDs) as components are exploited to perform touch sensing. It is then not necessary that a display include additional components for sensing, reducing its size and cost of manufacture.

The present invention provides a LED circuit comprising a LED array, a driving module, a sensing module, and a processing module. The LED array includes a plurality of LEDs. The driving module is coupled to the LED array and, subject to a first control signal, provides a first current path, on which at least one of the LEDs is set in a driven mode. The sensing module is likewise coupled to the LED array and, subject to a second control signal, provides a second current path, on which at least one of the LEDs is set in a sensing mode. The processing module is coupled respectively to the driving module and the sensing module, and is configured to selectively provide the first control signal or the second control signal. When at least one the LEDs is set in the sensing mode, the sensing module determines whether the intensity of an environmental light is below a first threshold. When said intensity is below the first threshold, the sensing module marks the location corresponding to at least one of the LEDs as a touch location.

In some embodiments, the first control signal corresponds to a first level of a driving signal, whereas the second control signal corresponds to a second level of the driving signal. In addition, at least one of the LEDs may be forward biased when set in the driven mode, and reverse biased when set in the sensing mode. The sensing module may further obtain a photocurrent generated by at least one of the LEDs according to the environmental light, and determines whether the intensity of the photocurrent is below a second threshold. When the intensity of the photocurrent is below the second threshold, the sensing module determines that the intensity of the environmental light is below the first threshold.

The present invention provides a touch sensing method whereby the characteristics inherent to LEDs as components are exploited to perform touch sensing. It is then not necessary that a display include additional components for sensing, reducing its size and cost of manufacture.

The present invention provides a touch sensing method for use with a LED array. There is a plurality of LEDs in the LED array. Said touch sensing method comprises the following steps. First, a driving signal is provided. The driving signal is configured to set at least one of the LEDs in a driven mode or a sensing mode. When a LED is set in the sensing mode, that LED receives an environmental light. It is then determined whether the intensity of the environmental light is below a first threshold. When the intensity of the environmental light is below the first threshold, the location corresponding to that LED is marked as a touch location.

In some embodiments, determining whether the intensity of the environmental light is below the first threshold further comprises: obtaining a photocurrent generated by the LED according to the environmental light; and determining whether the intensity of the photocurrent is below a second threshold. When the intensity of the photocurrent is below the second threshold, the intensity of the environmental light is determined to be below the first threshold. In addition, the LED may generate an emitted light when that LED is set in the driven mode. The spectra of the emitted light and the environmental light may differ.

To summarize, the present invention provides a LED circuit and a touch sensing method for a LED array. Environmental light is sensed by the LEDs in the array, and changes in environmental light are interpreted as touches. It is then not necessary that a display include additional components for sensing, reducing its size and cost of manufacture.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
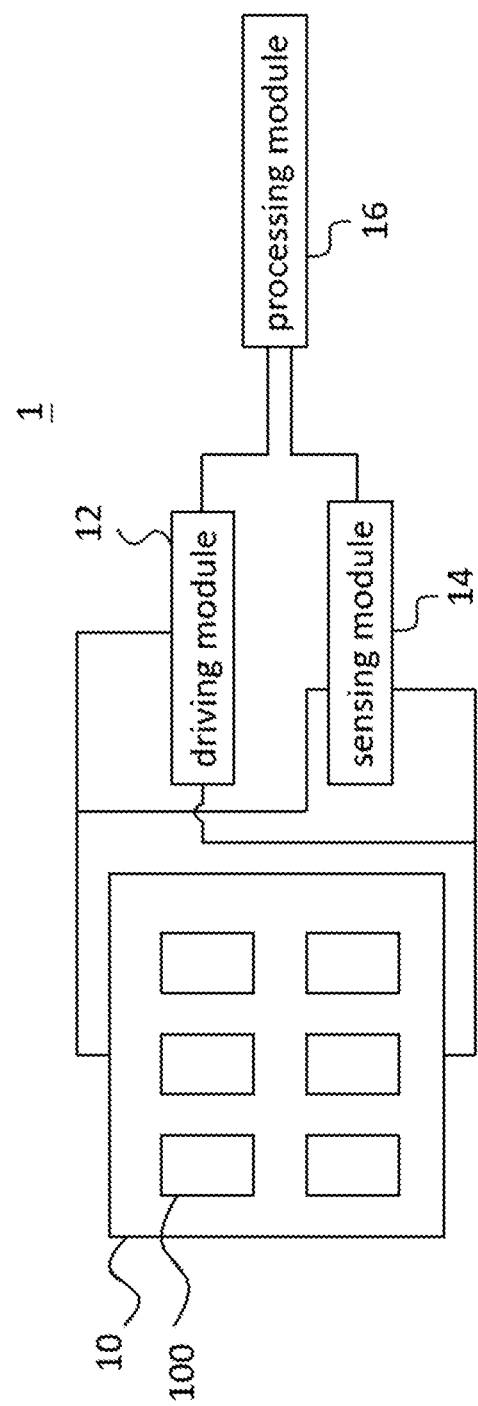
FIG. 1 is the functional block diagram of a LED circuit in accordance with an embodiment of the present invention.

Please refer to FIG. 1, the functional block diagram of a LED circuit in accordance with an embodiment of the present invention. As shown in FIG. 1, a LED circuit 1 comprises a LED array 10, a driving module 12, a sensing module 14, and a processing module 16. The LED array 10 is coupled respectively to the driving module 12 and the sensing module 14. Likewise, the processing module 16 is coupled respectively to the driving module 12 and the sensing module 14. In practice, the LED circuit 1 may be integrated in a variety of electronic products. Specifically, the LED array 10 may serve as a display screen for an electronic product, which may be a wearable device or a mobile phone.

The LED array 10 is an array consisting of a plurality of light-emitting diodes (LEDs) 100. The present embodiment poses no delimitation on the size of the LED array 10; as long as it fits the screen dimensions of said electronic product, the description of the LED array 10 of the present embodiment hold. The LEDs 100 on the same row of the LED array 10 may couple with one another; so may those LEDs 100 on the same column of the LED array 10. The present embodiment poses restriction neither on LED couplings, nor on what each of the LEDs 100 is made from. Neighboring LEDs 100 may be doped dissimilarly to respectively emit light of different colors. In other words, the plurality of LEDs 100 may include an indefinite number of red, green, blue, or white LEDs. The doping material may be gallium arsenide phosphide (GaAsP), indium gallium nitride (InGaN), gallium nitride (GaN), gallium phosphide (GaP), aluminium gallium indium phosphide (AlGaInP), aluminium gallium phosphide (AlGaP), or some other substance. In certain embodiments, one of the LEDs 100 may be an organic light-emitting diode (OLED).

The driving module 12, subject to or controlled by a first control signal (not shown in FIG. 1), provides a first current path. At least one of the LEDs 100 is set in a driven mode on the first current path. In practice, the driving module 12 may be conducting or activated based on the first control signal, thereby providing the first current path for a LED 100. On the first current path, the p-side voltage of the LED 100 is higher than the n-side voltage; that is, the LED 100 is forward biased and may then be defined as in the driven mode. In one embodiment, the LED 100 in said driven mode may emit light (an emitted light), whose intensity may be adjusted by the driving module 12. Of course, as a person skilled in the art would understand, the intensity of the emitted light of each LED 100 may correspond to an image being displayed, on which case the present embodiment poses no restriction.

The sensing module 14, subject to or controlled by a second control signal (not shown in FIG. 1), provides a second current path. At least one of the LEDs 100 is set in a sensing mode on the second current path. In practice, the sensing module 14 may be conducting or activated based on the second control signal, thereby providing the second current path for a LED 100. On the second current path, the p-side voltage of the LED 100 is lower than or on par with the n-side voltage; that is, the LED 100 is reverse biased and may then be defined as in the sensing mode. In one embodiment, the LED 100 in said sensing mode may receive an environmental light, by which intensity the sensing module 14 determines whether a touch has occurred. Note that the environmental light is distinct from the emitted light from the LED 100, the former being light entering the LED circuit 1 from the outside, such as lamplight, sunlight, or light generated by other electronic products. In one embodiment, the spectrum of the environmental light definably differs from the spectrum of the emitted light from the LED 100.

The processing module 16 is configured to provide the first or the second control signal. In practice, the processing module 16 does not provide the first and the second control signals at the same time. In one embodiment, the first control signal corresponds to a first level (e.g. a high one) of a driving signal, and the second control signal corresponds to a second level (e.g. a low one) of the driving signal. The first control signal causes a LED 100 to operate in the driven mode; that is, that the LED 100 is in the driven mode corresponds to the first level of the driving signal. In contrast, the second control signal causes the LED 100 to operate in the sensing mode, or that the LED 100 is in the sensing mode corresponds to the second level of the driving signal. In actual operation, when the driving signal is at a high level, the LED array 10 may be thought as displaying an image while set in the driven mode; and when the driving signal is at a low level, the LED array 10 may be thought as set in the sensing mode, displaying nothing.

Please note that the present embodiment does not stipulate that the first and the second control signals correspond to a high level and a low level of the driving signal, respectively. The first and the second control signals may be two separate and independent signals; as long as the processing module 16 does not generate them simultaneously, the description of the present embodiment holds. For instance, the second control signal may be a blank signal often seen in displays, so that some LEDs 100 of the LED array 10 may be set in the sensing mode at once during a sensing period. In addition, the present embodiment does not limit the time a LED 100 operates in the driven mode or the sensing mode. As an example, the time the LED 100 operates in the sensing mode may be related to the driving signal's duty cycle. The greater the duty cycle, the less time the LED 100 operates in the sensing mode. Moreover, the LEDs 100 of the LED array 10 may be set concurrently in the sensing mode during a sensing period.

Figure 2:
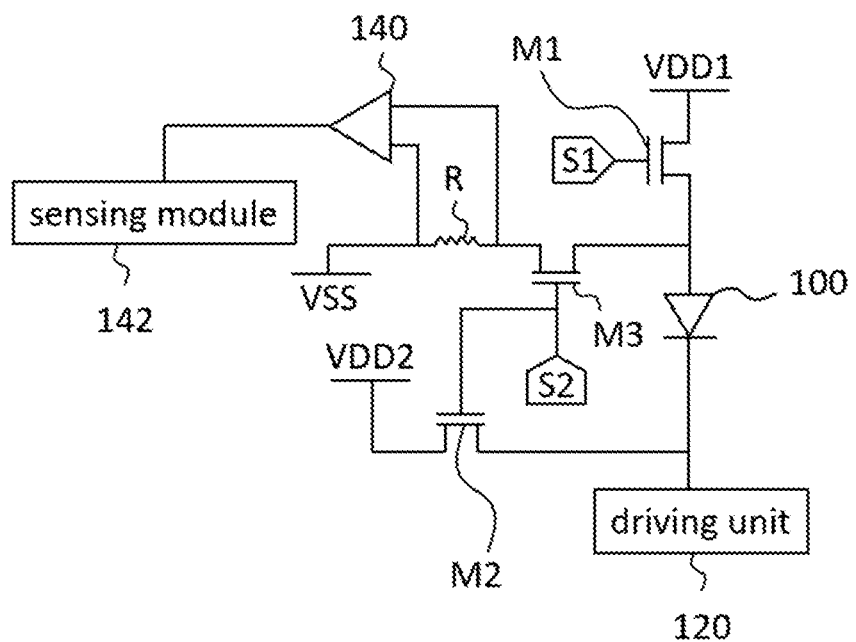
FIG. 2 is the circuit diagram of a LED circuit in accordance with an embodiment of the present invention.

To further illustrate the present invention for the benefit of those skilled in the art, FIGS. 1 and 2 shall now be considered in conjunction. FIG. 2 is the circuit diagram of a LED circuit in accordance with an embodiment of the present invention. In the following example, only the control of one LED 100 of the LED array 10 is demonstrated, but as a person skilled in the art would understand, the control may readily extend to more LEDs 100.

In the embodiment associated with FIG. 2, the driving module 12 may comprise a switch M1 and a driving unit 120. One terminal of the switch M1 is coupled with a system high voltage VDD1, while the other terminal of the switch M1 is coupled with the p-side of the LED 100. The driving unit 120 is coupled with the n-side of the LED 100. The switch M1 may include a control terminal that is coupled to the processing module 16 and subject to the first control signal S1. Given that the processing module 16 does not provide the first control signal S1 and the second control signal S2 at the same time, in actual operation when the switch M1 is conducting as directed by the first control signal S1, the p-side of the LED 100 is electrically connected to the system high voltage VDD1, and the n-side to the driving unit 120. Here the driving unit 120 may be a controllable current source that, based on the image being displayed, modulates the intensity of the current flowing through the LED 100, thereby adjusting the brightness of the LED 100. In one embodiment, the first current path may start at the system high voltage VDD1, continue through the switch M1 and the LED 100, and finally reach the driving unit 120. Since the voltage on the p-side of the LED 100 is higher than that on the n-side, the LED 100 is forward biased and operates in the driven mode.

Meanwhile, the sensing module 14 may comprise switches M2 and M3, a resistor R, an amplifier 140, and a sensing unit 142. One terminal of the switch M2 is coupled with a system high voltage VDD2, while the other terminal of the switch M2 is coupled with the n-side of the LED 100. One terminal of the switch M3 is coupled with the p-side of the LED 100, while the other terminal of the switch M3 is serially connected with the resistor R and electrically connected to a system low voltage VSS. The switches M2 and M3 may each include control terminals that are coupled to the processing module 16 and subject to the second control signal S2. The amplifier 140 is configured to retrieve the voltage difference between either side of the resistor R and convey said difference to the sensing unit 142. In actual operation, when the switches M2 and M3 are conducting as directed by the second control signal S2, the n-side of the LED 100 is electrically connected to the system high voltage VDD2, and the p-side to the system low voltage VSS. In one embodiment, the second current path may start at the system high voltage VDD2, continue through the switch M2, the LED 100, the switch M3, the resistor R, and finally reach the system low voltage VSS. Since the voltage on the p-side of the LED 100 is lower than or equal to that on the n-side, the LED 100 is reverse biased and operates in the sensing mode.

In practice, the LED 100 does not emit light in the sensing mode, but may generate a slight photocurrent due to stimulation by environmental light, in accordance with the photovoltaic effect. In other words, the photocurrent exists on the second current path and flows from the system high voltage VDD2 toward the system low voltage VSS. In one embodiment, the voltage difference retrieved between either side of the resistor R, i.e. the product of the photocurrent and the resistance R, may be employed to determine the intensity of the photocurrent. The photocurrent is of a lesser order of magnitude, so the aforementioned voltage difference is smaller. In the present embodiment, the amplifier 140 amplifies said difference, and feeds the gain into the sensing unit 142 for subsequent determining by the latter. The amplifier 140 is not a requisite in the present embodiment. If the sensing unit 142 is sensitive enough, it can read directly the voltage difference between either side of the resistor R without relying on the amplifier 140.

Suppose that the LED circuit 1 is installed in a mobile phone. The LED array 10 is then the phone's screen. When a user slides on or presses the screen, i.e. the LED array 10, with his or her finger or stylus, there are probably some of the LEDs 100 of the LED array 10 not located where the finger or stylus touches. The LEDs 100 at 'untouched' locations are not covered and are thus able to receive environmental light without impediment. In contrast, some of the other LEDs 100 are located right at or around where the finger or stylus touches. This latter group of LEDs 100, covered or shielded by the finger or stylus, receives a significantly less amount of environmental light, if any. Without stimulation by enough of environmental light, the generated photocurrent is significantly subdued.

The sensing unit 142 can calculate the intensity of the photocurrent corresponding to the LED 100 with the resistance R's known value and by sensing the voltage difference between either side of the resistor R, thereby determining whether the intensity of the photocurrent is below a second threshold. When the sensing unit 142 determines that the intensity of the photocurrent is indeed below the second threshold, it deduces that the LED 100 at the corresponding location is covered by the finger or stylus, and marks that location corresponding to the LED 100 as a touch location of the finger or stylus. Conversely, when the sensing unit 142 determines that the intensity of the photocurrent is not below the second threshold, it deduces that the LED 100 at the corresponding location is not covered, and refrains from marking that location corresponding to the LED 100 as a touch location of the finger or stylus. Furthermore, given the correspondence between the intensities of the photocurrent and the received environmental light, it can be obtained that the intensity of the environmental light is below a threshold of brightness (a first threshold) when the sensing unit 142 determines that the intensity of the photocurrent is below the second threshold.

In practice, the sensing unit 142 may determine more than whether the intensity of the photocurrent is below the second threshold. The sensing unit 142 may determine whether the intensity of the photocurrent is below a third threshold, the third threshold being higher than the second. Hereby the sensing unit 142 may obtain more information on the touches. For instance, a LED 100 wholly covered by the finger or stylus barely generates any photocurrent, so the sensing unit 142 is more or less certain that the location corresponding to that LED 100 is a touch location. On the other hand, if the finger or stylus merely hovers above or around the LED 100, casting a shadow over it, the sensing unit 142 might not consider the location of the LED 100 to be a touch location, because the LED 100, upon receiving environmental light, still generates some photocurrent despite being in the shadow. The fact that said LED 100, compared with other, uncovered LEDs 100, receives less environmental light and generates a weaker photocurrent is beside the point.

In other words, by setting the second and the third thresholds adequately, one can tell which LEDs 100 are wholly covered by the finger or stylus, and which are just in the shadow, and thus misjudge touch locations less frequently. In addition, the number of LEDs 100 connected to the sensing module 14 may not be the same as the number of all LEDs 100 in the LED array 10. Owing to a higher and higher requirement for screen resolutions in electronic products, the space between the LEDs 100 may be far smaller than the touch area of the finger or stylus. In one embodiment, therefore, the LED array 10 is divided into touch sensing zones, in each of which only a selected few LEDs 100 are connected to the sensing module 14. It remains an option in the present embodiment, of course, for the sensing module 14 to connect to all LEDs 100 in the LED array 10.

Figure 3:
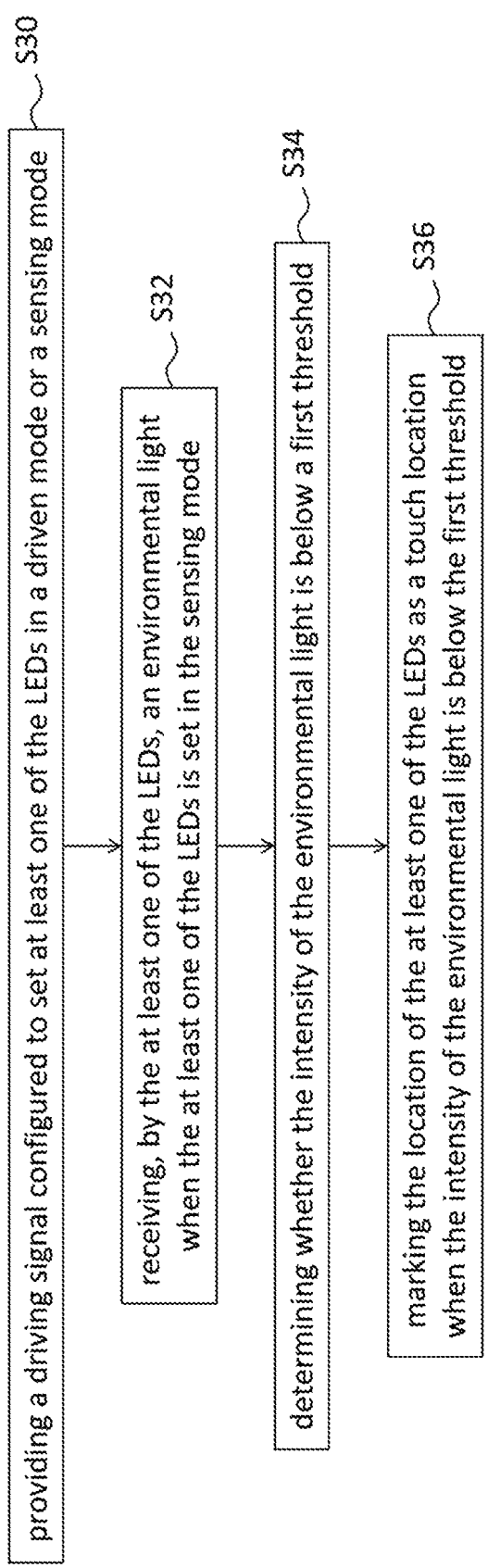
FIG. 3 is the flow chart of a touch sensing method in accordance with an embodiment of the present invention.

To further illustrate the touch sensing method of the present invention, FIGS. 1, 2, and 3 shall now be considered in conjunction. FIG. 3 is the flow chart of a touch sensing method in accordance with an embodiment of the present invention. As shown in FIG. 3, in step S30, the processing module 16 provides the driving signal, which corresponds to the first control signal S1 and the second control signal S2 respectively, to set at least one LED 100 in the driven mode or the sensing mode. In step S32, said LED 100 receives an environmental light while set in the sensing mode. The sensing module 14 determines in step S34 whether the intensity of the environmental light received by the LED 100 is below the first threshold, and, when that is indeed the case, marks in step S36 the location corresponding to the LED 100 as a touch location. Details of the present embodiment can be found within the description of the previous embodiments and will not be repeated here.

To summarize, the present invention provides a LED circuit and a touch sensing method for a LED array. Based on changes in the environmental light received by the LEDs in the array, the sensing module is enabled to determine whether the locations corresponding to certain LEDs are touched. It is then not necessary that a display include additional components for sensing, reducing its size and cost of manufacture.

What is claimed is:

1. A touch sensing method for a LED array, the LED array including a plurality of LEDs, the touch sensing method comprising:
    providing a driving signal configured to set at least one of the LEDs in a driven mode or a sensing mode;
    receiving, by the at least one of the LEDs, an environmental light when the at least one of the LEDs is set in the sensing mode;
    determining whether the intensity of the environmental light is below a first threshold; and
    marking the location corresponding to the at least one of the LEDs as a touch location when the intensity of the environmental light is below the first threshold,
    wherein the step of determining whether the intensity of the environmental light is below the first threshold further comprises:
    obtaining a photocurrent generated by the at least one of the LEDs according to the environmental light; and
    determining whether the intensity of the photocurrent is below a second threshold,
    wherein the intensity of the environmental light is below the first threshold when the intensity of the photocurrent is below the second threshold.

2. The touch sensing method according to claim 1, wherein the driven mode corresponds to a first level of the driving signal, and the sensing mode corresponds to a second level of the driving signal.

3. The touch sensing method according to claim 1, further comprising:
    generating, by the at least one of the LEDs, an emitted light when the at least one of the LEDs is set in the driven mode.

4. The touch sensing method according to claim 3, wherein the spectrum of the environmental light differs from the spectrum of the emitted light.

5. The touch sensing method according to claim 3, further comprising:
    setting concurrently the LEDs of the LED array in the sensing mode during a sensing period.

6. A LED circuit, comprising:
    a LED array including a plurality of LEDs;
    a driving module coupled to the LED array and providing, subject to a first control signal, a first current path;
    a sensing module coupled to the LED array and providing, subject to a second control signal, a second current path; and
    a processing module coupled respectively to the driving module and the sensing module and configured to selectively provide the first control signal or the second control signal;
    wherein on the first current path at least one of the LEDs is set in a driven mode, and on the second current path at least one of the LEDs is set in a sensing mode;
    wherein the sensing module determines whether the intensity of an environmental light is below a first threshold when at least one the LEDs is set in the sensing mode, and marks the location corresponding to at least one of the LEDs as a touch location when the intensity of the environmental light is below the first threshold,
    wherein the sensing module further obtains a photocurrent generated by at least one of the LEDs according to the environmental light, and determines whether the intensity of the photocurrent is below a second threshold.

7. The LED circuit according to claim 6, wherein the first control signal corresponds to a first level of a driving signal, and the second control signal corresponds to a second level of the driving signal.

8. The LED circuit according to claim 6, wherein at least one of the LEDs is forward biased when set in the driven mode, and reverse biased when set in the sensing mode.

9. The LED circuit according to claim 6, wherein the sensing module determines that the intensity of the environmental light is below the first threshold when the intensity of the photocurrent is below the second threshold.

* * * * *